United States Patent [19]

Hattori et al.

[11] Patent Number: 5,305,053
[45] Date of Patent: Apr. 19, 1994

[54] IMAGE FORMING APPARATUS

[75] Inventors: Yasuhiro Hattori, Nagoya; Masashi Tsuda, Haguri, both of Japan

[73] Assignee: Brother Kogyo Kabushiki Kaisha, Nagoya, Japan

[21] Appl. No.: 20,392

[22] Filed: Feb. 22, 1993

[30] Foreign Application Priority Data

May 14, 1992 [JP] Japan .................................. 4-121822
May 25, 1992 [JP] Japan .................................. 4-132361

[51] Int. Cl.$^5$ ........................ G03B 27/32; G03B 27/52
[52] U.S. Cl. ....................................... 355/27; 430/138
[58] Field of Search ........................... 355/27; 430/138

[56] References Cited

U.S. PATENT DOCUMENTS

| | | |
|---|---|---|
| 2,800,457 | 7/1957 | Green et al. . |
| 2,800,458 | 7/1957 | Green et al. . |
| 5,196,882 | 3/1993 | Kondo .............................. 355/27 |
| 5,213,940 | 5/1993 | Inaishi et al. ..................... 430/138 |

FOREIGN PATENT DOCUMENTS

| | | |
|---|---|---|
| 36-91678 | 6/1961 | Japan . |
| 42-446 | 1/1967 | Japan . |
| 42-771 | 1/1967 | Japan . |
| 51-9079 | 1/1976 | Japan . |
| 3-124919 | 4/1991 | Japan . |
| 3-124920 | 4/1991 | Japan . |
| 3-124921 | 4/1991 | Japan . |
| 952807 | 3/1964 | United Kingdom . |

*Primary Examiner*—Monroe H. Hayes
*Attorney, Agent, or Firm*—Oliff & Berridge

[57] ABSTRACT

An image forming apparatus for forming an image by use of photosensitive microcapsules each consisting of an outer shell and a liquid component encapsulated in the outer shell. The liquid component contains an image forming material and a photocuring substance that is polymerized by light. The microcapsules are electrically charged to be supported on a support member. Then, the microcapsules are exposed to light having image information to selectively harden the microcapsules. The microcapsules not cured are ruptured to discharge the image forming material, thereby forming an image by the image forming material on an image receiving paper. Then, a residue inclusive of the remaining microcapsules and a part of the liquid component left on the support member are exposed again to light to be cured and solidified. The solidified residue on the support member is wholly removed by a cleaning member. Accordingly, the support member can be repeatedly used and a clear image with no stain can be formed on the image receiving paper.

26 Claims, 3 Drawing Sheets

IMAGE FORMING APPARATUS

BACKGROUND OF THE INVENTION

1. Field of the Invention

The invention relates to an image forming apparatus and, more particularly, to an image forming apparatus such as a monochromatic or full color copying machine or printer using a photosensitive microcapsule.

2. Description of Related Art

Conventionally known is a so-called photosensitive microcapsule formed by encapsulating a core substance in an outer shell. The core substance is composed of an image forming material and a photocuring substance. The image forming material is a dye precursor, dye or pigment. The photocuring substance is sensitive to light having a certain wavelength to change its mechanical strength. The outer shell is formed of resin. Accordingly, the photosensitive microcapsule is cured when exposed to light having a certain wavelength.

Further, an image forming apparatus using such a photosensitive microcapsule is also generally known. The image forming apparatus employs a photosensitive medium formed by coating a plurality of photosensitive microcapsules with a binder on a substrate. The substrate is a plastic film formed of PET (polyethylene terephthalate). In forming an image, the photosensitive medium supporting the photosensitive microcapsules is first exposed to light having image information. As a result, the photosensitive microcapsules on the photosensitive medium are selectively cured to thereby form a chemical latent image according to differences in the mechanical strength between the photosensitive microcapsules on the photosensitive medium. Thereafter, an image receiving medium is superimposed with the photosensitive medium, on which the chemical latent image has been formed, and a pressure is applied to the image receiving medium and the photosensitive medium, thereby rupturing uncured ones of the photosensitive microcapsules to discharge the image forming material from the ruptured microcapsules.

In the case where the image forming material is a dye precursor, a special paper having a developer layer as an absorbing layer is used as the image receiving medium, while in the case where the image forming material is a dye or a pigment, a plain paper or the like is used as the image receiving medium. The image forming material discharged from the microcapsules is absorbed by or deposited on the image receiving medium, thereby forming an image on the image receiving medium.

However, the photosensitive medium to be used in this apparatus employs a plastic film as the substrate as mentioned above. Once the image is formed with use of the photosensitive medium, the substrate of the photosensitive medium is discarded with the spent microcapsules in spite of the fact that the substrate does not directly contribute to the image formation. Accordingly, the operating cost is high in this image forming apparatus.

To cope with this problem, the same applicant as that of the present application has disclosed, in Japanese Patent Application No. 3-124919, an image forming apparatus capable of forming an image by using only powdered photosensitive microcapsules without using a substrate as described above.

In this image forming apparatus, the powdered photosensitive microcapsules are first applied, in a dry condition, to a support member formed as an endless belt or a roller. Then, the coating of the photosensitive microcapsules on the support member is exposed to light having image information. As a result, the photosensitive microcapsules on the support member are selectively cured to thereby form a chemical latent image according to differences in the mechanical strength between the photosensitive microcapsules on the support member. Then, the support member is superposed on an image receiving medium and they are pressed by a pressure roller or other means for the application of pressure. As a result, the uncured photosensitive microcapsules are ruptured and the core substance of the uncured microcapsules is discharged. The core substance thus discharged from the ruptured microcapsules is transferred to the image receiving medium, thereby forming an image on the image receiving medium. Thereafter, a residue, including the cured photosensitive microcapsules and the outer shells of the ruptured microcapsules, left on the support member is removed from the support member by a cleaning blade or similar apparatus. Thus, the support member can be used repeatedly.

However, the above residue also contains some of the core substance. Since the core substance is a liquid material containing an adhesive polymerizable monomer as a primary component, it is difficult to completely remove the residue from the support member by using a cleaning blade or similar apparatus. Accordingly, the support member is imperfectly cleaned as it is repeatedly used so that a clear image cannot be formed on the image receiving medium.

SUMMARY OF THE INVENTION

It is accordingly an object of the invention to do provide an image forming apparatus which can always form a clear image at a low operating cost.

According to the invention, there is provided an image forming apparatus using a photosensitive microcapsule consisting of an outer shell and a core substance encapsulated in the outer shell, the core substance containing an image forming material and a photocuring substance, the image forming material being selected from a group consisting of a dye precursor, a dye and a pigment, the photocuring substance being polymerizable to be cured by application of light thereto; the image forming apparatus comprising a support member for supporting the photosensitive microcapsules thereon, first exposure means for exposing the photosensitive microcapsules supported on the support member to light, means for rupturing the photosensitive microcapsules after being exposed to light by the first exposure means to discharge the core substance from the photosensitive microcapsules and thereby form an image on an image receiving medium, means for cleaning the support member to allow repeated use of the support member, and second exposure means provided in the cleaning means for exposing to light a residue left on the support member after forming the image on the image receiving medium.

With this structure, the photosensitive microcapsules supported on the support member, after exposure by the first exposure means, are ruptured by the rupturing means to discharge the core substance containing the image forming material from the ruptured photosensitive microcapsules. Thereafter, the residue, including the outer shell of the ruptured microcapsules and a part of the core substance left on the support member after forming the image on the image receiving medium, is exposed to light by the second exposure means provided in the cleaning means. Since the core substance contains a photocuring substance polymerizable to be cured by the application of light thereto, the core substance in the residue is cured by the light applied from the second exposure means. Thus, the residue after being exposed by the second exposure means, becomes solid. Accordingly, the residue thus solidified can be easily and completely removed by the cleaning means. That is, the support member can be perfectly cleaned and a clear image can be formed on the image receiving medium all the time.

BRIEF DESCRIPTION OF THE DRAWINGS

Preferred embodiments of the invention will be described in detail with reference to the following figures, wherein.

DESCRIPTION OF THE PREFERRED EMBODIMENTS

A preferred embodiment of the invention will now be described with reference to the drawings.

Figure 4:
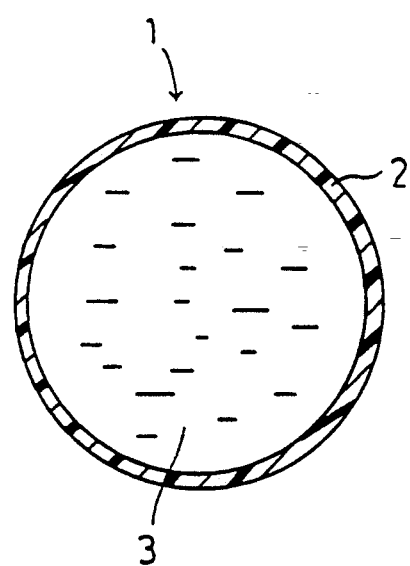
FIG. 4 is a schematic enlarged sectional view of a photosensitive microcapsule to be used in the image forming apparatus according to the invention.

First, a structure of a photosensitive microcapsule 1 to be used in the preferred embodiment will be described with reference to FIG. 4.

The photosensitive microcapsule 1 consists of an outer shell 2 and a liquid component 3 encapsulated in the outer shell 2. The liquid component 3 contains at least an image forming material and a photosensitive substance. The image forming material is selected from a dye precursor, a dye, and a pigment. The photosensitive substance is sensitive to light having a certain wavelength to change the substance's mechanical strength.

Examples of the dye to be used as the image forming material include xanthene dyes, coumarin dyes, merocyanine dyes, thiazine dyes, azine dyes, methine dyes, oxazine dyes, phenylmethane dyes, cyanine dyes, azo dyes, anthraquinone dyes, pyrazoline dyes, stilbene dyes, quinoline dyes, phthalocyanine dyes, and leuco dyes. The pigment to be used as the image forming material may be an inorganic pigment or an organic pigment. Examples of the inorganic or organic pigment include carbon black, chrome yellow, red iron oxide, titanium oxide, and molybdate orange.

Examples of the dye precursor to be used as the image forming material include diphenylmethane compounds, triphenylmethane compounds, bisphenylmethane compounds, xanthene compounds, thiazine compounds, flurorane compounds, and spiropyran compounds. One or more of the above substances may be used as the dye, the pigment or the dye precursor for the image forming material. In particular, when using the dye precursor as the image forming material, it is necessary to use an image receiving medium having a developer layer as an absorbing layer.

The photosensitive substance is a resin sensitive to light having a certain wavelength to change the substance's mechanical strength. Such a resin may be a photosoftening resin or a photocuring resin, for example. A photocuring resin is normally used as a mixture of a photopolymerization initiator and a polymerizable substance. The photopolymerization initiator is sensitive to light to initiate polymerization of the resin. Examples of the photopolymerization initiator include benzophenone, benzoylalkyl ethers such as benzoylisopropyl ether, Michler's ketone, metal allene compounds, and 2,4-diethylthioxanthone. Examples of the polymerizable substance include N-vinyl-2-pyrrolidone, bisphenol A diacrylate, bisphenol A dimethacrylate, tripropylene glycol diacrylate, tripropylene glycol dimethacrylate, polyethylene glycol diacrylate, polyethylene glycol dimethacrylate, pentaerythritol triacrylate, pentaerythritol trimethacrylate, dipentaerythritol hexaacrylate, dipentaerythritol hexamethacrylate, trimethylolpropane triacrylate, trimethylolpropane trimethacrylate, oligoester acrylate, and oligoester methacrylate. One or more of these polymerizable compounds may be used.

The photosensitive microcapsule 1 as mentioned above may be produced by a known method in the industry such as a method of phase separation from an aqueous solution as disclosed in U.S. Pat. Nos. 2,800,457 and 2,800,458, an interfacial polymerization method as disclosed in Japanese Patent Publication Nos. 42-446 and 42-771, an in-situ method by polymerization of a monomer as disclosed in Japanese Patent Publication No. 36-9168 and Japanese Patent Laid-open No. 51-9079, or a dispersion cooling method as disclosed in British Patent No. 952,807. These methods are merely illustrative, but any other known method may be employable.

In this preferred embodiment, the photosensitive microcapsules 1 are obtained by emulsifying the liquid component 3 in water and performing a known microcapsulation method called an in-situ method to encapsulate the liquid component 3 inside the outer shell 2 made of a resin. As the photosensitive microcapsules 1 thus obtained are dispersed in the water, they are dried to be pulverized by a spray drying method or a freeze drying method. The powdered photosensitive microcapsules 1 have an average particle size of 10 $\mu$m, and the outer shell 2 has a wall thickness of about 0.001-0.1 $\mu$m.

Examples of the material for forming the outer shell 2 include gelatin, gum arabic, starch, sodium alginate, polyvinyl alcohol, polyethylene, polyamide, polyester, polyurethane, polyurea, polystyrene, nitrocellulose, ethyl cellulose, methyl cellulose, melamineformaldehyde resin, and urea-formaldehyde resin. It is preferable that these materials can sufficiently transmit light.

The photosensitive microcapsule 1 of the preferred embodiment has the capability of reproducing any one color of yellow, magenta and cyan, so as to enable production of a full color image. The photosensitive microcapsule for reproducing yellow contains an yellow image forming material and a photocuring substance having a maximum curing sensitivity to light having a wavelength near 450 nm of blue light. The photosensitive microcapsule for reproducing magenta contains a magenta image forming material and a photocuring substance having a maximum curing sensitivity to light having a wavelength near 550 nm of green light. The photosensitive microcapsule for reproducing cyan contains a cyan image forming material and a photocuring substance having a maximum curing sensitivity to light having a wavelength near 650 nm of red light.

The structure of an image forming apparatus in a first preferred embodiment according to the invention will be described with reference to FIG. 1.

Reference numeral 7 generally designates an image forming apparatus in the first preferred embodiment. An eject opening 53 for ejecting an image receiving paper 52 after an image has been formed thereon is formed through a side wall of a housing of the image forming apparatus 7 at a left lower portion thereof as viewed in FIG. 1. An original table 16 is provided on an upper surface of the housing so as to be movable rightward and leftward as viewed in FIG. 1. The original table 16 comprises an original cover 13 and an original glass plate 15. The original cover 13 is pivotably supported to a shaft (not shown). In setting an original 12 on the original table 16, an operator upwardly opens the original cover 13 and then places the original 12 on the original glass plate 15 with an image formed surface of the original 12 facing the original glass plate 15. Then, the operator downwardly closes the original cover 13. The original table 16 is adapted to be moved rightward and leftward by a driving source (not shown) in synchronism with rotation of a microcapsule supporting member 44 to be hereinafter described.

The interior of the housing of the image forming apparatus 7 is generally constructed of an exposure section 10, a microcapsule supplying section 20, a cleaning section 30, the microcapsule supporting member 44, a transfer member 45, and a paper feeding section 50.

The exposure section 10 comprises an exposure lamp 11, a filter 14, and a light shielding plate 19. The exposure section 10 serves to expose to light the photosensitive microcapsules 1 on the microcapsule supporting member 44 according to the image of the original 12 set on the original table 16. The exposure lamp 11 is a halogen lamp, for example, and it serves to apply light to the original 12 set on the original table 16. The light applied to the original 12 is reflected from the image formed surface of the original 12 and is then imaged through the filter 14 onto the photosensitive microcapsules 1 on the microcapsule supporting member 44, described later. The filter 14 serves to adjust the tone of the light reflected from the image formed surface of the original 12. The light shielding plate 19 serves to shield the light so that the light having been transmitted through the filter 14 may be applied to a predetermined position only on the microcapsule supporting member 44.

The microcapsule supplying section 20 serves to supply the microcapsules 1 onto the microcapsule supporting member 44 by dry coating. The microcapsule supplying section 20 comprises a case 21, an agitator 23, a supply member 24, a carrier member 25, and a layer thickness regulating blade 26. The microcapsules 1 are stored in the case 21. The agitator 23, the supply member 24 and the carrier member 25 are provided in the case 21. In FIG. 1, each microcapsule 1 is shown with an exaggerated size for the convenience of understanding.

The agitator 23 is rotatably supported by a rotary shaft driven by a driving source (not shown). The agitator 23 serves to agitate the microcapsules 1 stored in the case 21 and thereby triboelectrically charge the microcapsules 1 to a predetermined polarity. The microcapsules 1 thus triboelectrically charged are electrostatically attached to the surface of the supply member 24.

The surface of the supply member 24 is in partial contact with a surface of the carrier member 25. The supply member 24 is rotated by a driving source (not shown) in a direction shown by an arrow in FIG. 1. Accordingly, the microcapsules 1, attached to the surface of the supply member 24, are rubbed by the surface of the carrier member 25 and are moved to the surface of the carrier member 25.

The surface of the carrier member 25 is partially exposed outside of the case 21 and the exposed part is opposed to a surface of the microcapsule supporting member 44 with a predetermined gap defined therebetween. The carrier member 25 is adapted to be rotated by a driving source (not shown) in a direction shown by an arrow in FIG. 1. Accordingly, the microcapsules 1 having been moved from the surface of the supply member 24 to the surface of the carrier member 25 are conveyed toward the surface of the microcapsule supporting member 44.

The layer thickness regulating blade 26 is provided in such a manner that its one end is close to the surface of the carrier member 25. The layer thickness regulating blade 26 serves to remove the microcapsules 1 excessively supplied to the surface of the carrier member 25, thereby making constant the thickness of a layer of the microcapsules 1 and also smoothening the surface of the layer. The microcapsules 1 deposited on the carrier member 25 in the form of the layer having the uniform thickness and the smooth surface are conveyed toward the surface of the microcapsule supporting member 44 by the rotation of the carrier member 25. An electric field for electrostatically applying the microcapsules 1 from the carrier member 25 to the microcapsule supporting member 44 is formed between the microcapsule supporting member 44 and the carrier member 25 by a DC or AC power source (not shown).

Figure 1:
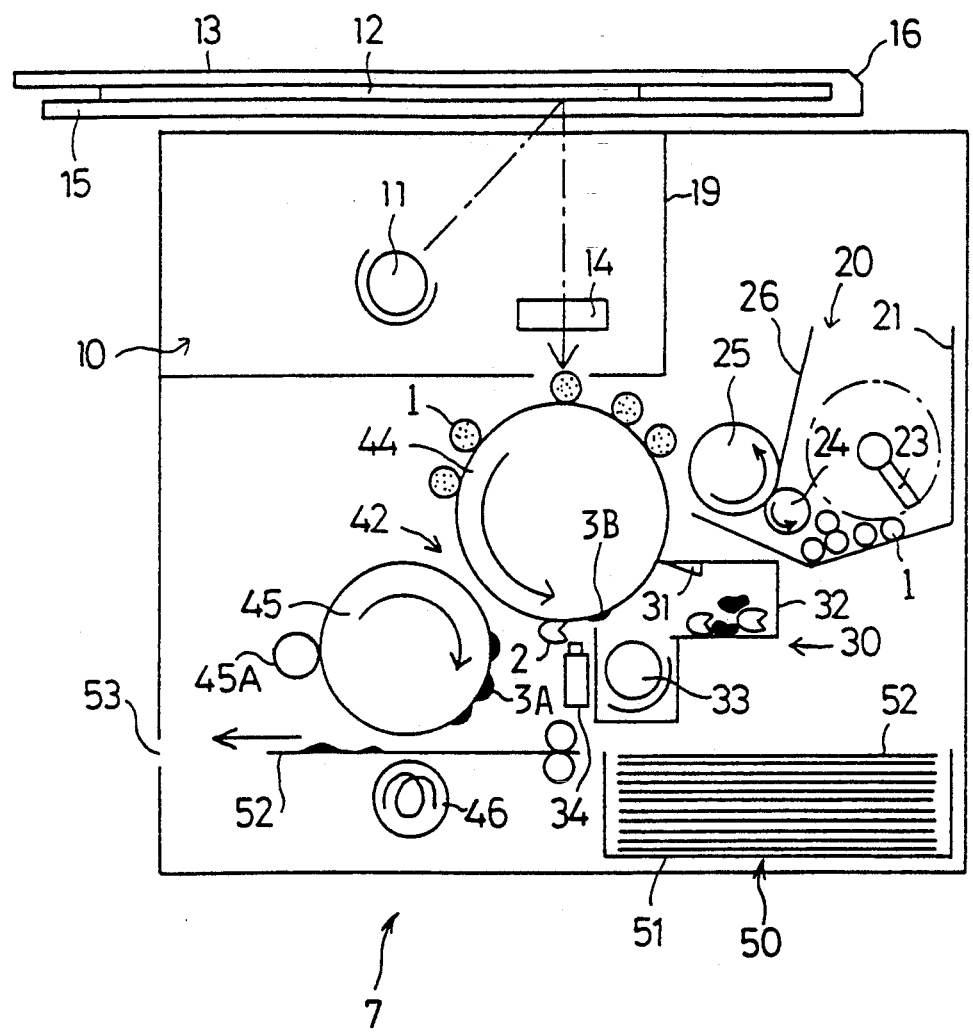
FIG. 1 is a schematic illustration of an image forming apparatus in a first preferred embodiment according to the invention.

The microcapsule supporting member 44 and the transfer member 45 are formed as columnar or cylindrical members having a diameter of about 30–200 mm and a length (in a direction parallel to the plane and perpendicular to the longitudinal axis of the paper sheet of FIG. 1) of about 300 mm. A predetermined pressure for rupturing the microcapsules 1 deposited on the surface of the microcapsule supporting member 44 is applied between the microcapsule supporting member 44 and the transfer member 45. Therefore, at least a core portion of each of the microcapsule supporting member 44 and the transfer member 45 is made of metal such as stainless steel or aluminum, so as to endure the above predetermined pressure. As required, a resin material for adding a protective function may be coated or bonded around the core portion. The resin material also increases the adherence of the microcapsules 1 to the microcapsule supporting member 44 and when applied to the transfer member 45 increases adherence of the liquid 3 while rejecting the ruptured outer shells 2. A pressure applying region where the microcapsule supporting member 44 contacts the transfer member 45 to rupture the microcapsules 1 is formed as a rupture region 42 (shown enlarged in FIG. 1). The microcapsules 1 are ruptured in the rupture region 42 to discharge the liquid component 3, which is in turn transferred onto the transfer member 45. Thereafter, the liquid component 3 is transferred from the transfer member 45 to the image receiving paper 52 as will be hereinafter described in detail. A cleaning member 45A such as a felt roller may be located at a suitable position downstream of the transfer position. The cleaning member 45A is in contact with the surface of the transfer member 45 to remove a part of the liquid component 3 remaining on the surface of the transfer member 45.

The cleaning section 30 is located in the proximity of the microcapsule supporting member 44. The cleaning section 30 comprises a cleaning blade 31, a recovery unit 32, an after-exposure lamp 33, and a nitrogen gas injector 34. The cleaning blade 31 is fixed to the recovery unit 32, and is located on the downstream side of the after-exposure lamp 33 with respect to a rotational direction of the microcapsule supporting member 44. The cleaning blade 31 is in contact with the surface of the microcapsule supporting member 44. The after-exposure lamp 33 is fixedly provided in the recovery unit 32 so as to apply light to a region of the surface of the microcapsule supporting member 44 on the downstream side of the rupture region 42 with respect to the rotational direction of the microcapsule supporting member 44. The light emitted from the after-exposure lamp 33 is prevented from reaching the rupture region 42 and transfer member 45 by a shield, a part of recovery unit 32, between the after-exposure lamp 33 and the nitrogen gas injector 34. Thus, the light from the after-exposure lamp only strikes the microcapsule supporting member 44 downstream of the rupture region 42.

The light source for the after-exposure lamp 33 is selected so that the light to be emitted therefrom may cure all kinds of the microcapsules 1. More specifically, the microcapsules 1 to be employed in this preferred embodiment are three kinds of microcapsules having the maximum curing sensitivities to three kinds of wavelengths, i.e., 450 nm, 550 nm, and 650 nm as mentioned above. Therefore, a white light source capable of emitting light including all the above wavelengths may be used as the light source of the after-exposure lamp 33. Alternatively, a plurality of light sources capable of emitting light having one or more of the above three kinds of wavelengths may be combined.

The nitrogen gas injector 34 is provided because the photocuring substance contained in the liquid component 3 of the microcapsule 1 is hard to cure in the presence of oxygen. The nitrogen gas injector 34 is located just upstream of the recovery unit 32 so as to inject nitrogen gas onto the surface of the microcapsule supporting member 44. Owing to the injection of the nitrogen gas, a residue inclusive of the cured microcapsules 1, the outer shell 2 of the ruptured microcapsules 1 and a part of the liquid component 3 left on the surface of the microcapsule supporting member 44 on the downstream side of the rupture region 42 are subjected to a nitrogen atmosphere free from oxygen. Therefore, when such a residue on the surface of the microcapsule supporting member 44 is exposed to light emitted from the after-exposure lamp 33, the liquid component 3 in the residue is generally cured by the light. If the nitrogen gas injector 34 is not provided, an inner portion of the liquid component 3 isolated from oxygen is cured, but a surface of the liquid component 3 is hard to cure because the surface is subject to an oxygen atmosphere. Accordingly, the provision of the nitrogen gas injector 34 improves the effectiveness of the invention.

The paper feeding section 50 comprises a paper feed cassette 51 and a paper conveying member (not shown). The paper feed cassette 51 is detachably mounted in the housing of the image forming apparatus 7. A plurality of sheets of the image receiving paper 52 can be stored in a stacked condition in the paper feed cassette 51. The paper conveying member serves to take the sheets of the image receiving paper 52 one by one out of the paper feed cassette 51 and convey the image receiving paper 52 thus taken out to the under side of the transfer member 45.

In the case where the image forming material contained in the microcapsule 1 is a dye precursor, a special paper coated with a developer is used as the image receiving paper 52. On the other hand, in the case where the image forming material contained in the microcapsule 1 is a dye or a pigment, a plain paper normally used in an electrophotographic copying machine may be used as the image receiving paper 52.

A heat roller 46, incorporating a heat source such as a halogen lamp or a resistor, is located under the transfer member 45. The image receiving paper 52 fed from the paper feed cassette 51 is supplied to between the transfer member 45 and the heat roller 46 (the gap therebetween being exaggerated in FIG. 1), and the image is transferred from the transfer member 45 to the image receiving paper 52 by the heat of the heat roller 46. The image receiving paper 52, on which the image has been formed, is ejected from the eject opening 53 to the outside of the image forming apparatus 7.

The operation of the image forming apparatus 7 in the first preferred embodiment will be described with reference to FIG. 1.

First, the operator opens the original cover 13 and places the original 12 on the original glass plate 15 with the image formed surface of the original 12 facing the original glass plate 15. Then, the operator closes the original cover 13 and turns on the start switch (not shown). As a result, the microcapsule supporting member 44 starts to be rotated in the direction shown by an arrow. In the microcapsule supplying section 20, the agitator 23 is rotated to triboelectrically charge the microcapsules 1 stored in the case 21, and the supply member 24 and the carrier member 25 are also rotated to carry the charged microcapsules 1 onto the carrier member 25. The microcapsules 1 carried on the carrier member 25, with a uniform layer thickness, are electrostatically attracted to the microcapsule supporting member 44 by an electric field formed between the microcapsule supporting member 44 and the carrier member 25. As a result, the microcapsules 1 are moved from the carrier member 25 to the microcapsule supporting member 44 and are attached to the surface of the microcapsule supporting member 44 by an electrostatic force. Thus, the surface of the microcapsule supporting member 44 is uniformly coated with the powder of the microcapsules 1.

The outer shell 2 of each microcapsule 1 has a sufficient strength such that the microcapsules 1 are not ruptured in the course of the above operation.

Then, the microcapsules 1 supported on the surface of the microcapsule supporting member 44 are conveyed to the under side of the exposure section 10 by the rotation of the microcapsule supporting member 44. At this time, the exposure lamp 11 in the exposure section 10 is turned on, and the original table 16 with the original 12 placed thereon is moved rightward and leftward, as viewed in FIG. 1, in synchronism with the rotation of the microcapsule supporting member 44. Thus, the exposure operation is carried out according to the original 12. The light emitted from the exposure lamp 11 and reflected from the image formed surface of the original 12 is allowed to pass through the filter 14, for adjusting the tone of the image, and is imaged on the surface of the layer of microcapsules 1 supported on the microcapsule supporting member 44.

In this manner, the microcapsules 1 on the microcapsule supporting member 44 are exposed to light according to image information of the original 12, and are selectively cured according to the exposure energy. Accordingly, a chemical latent image is formed in the layer of the microcapsules 1 on the microcapsule supporting member 44 owing to a difference in the mechanical strength between the microcapsules 1 according to the image information. Then, the microcapsules 1 on the microcapsule supporting member 44 are further conveyed to the rupture region 42 by the rotation of the microcapsule supporting member 44.

In the rupture region 42, a predetermined pressure is applied from the microcapsule supporting member 44 and the transfer member 45 to the microcapsules 1 and only the uncured microcapsules 1 are ruptured by the predetermined pressure. As a result, the liquid component 3 containing the image forming material is discharged from the ruptured microcapsules 1. As the microcapsules 1 on the microcapsule supporting member 44 are in contact with the transfer member 45, a large part 3A of the liquid component 3 is transferred onto the transfer member 45. On the other hand, a remaining part 3B of the liquid component 3 and the outer shell 2 of the ruptured microcapsules 1 are left on the microcapsule supporting member 44. Further, cured ones of the microcapsules 1 are also left on the microcapsule supporting member 44 because they have not been ruptured in the rupture region 42.

Such a residue left on the microcapsule supporting member 44 is conveyed to the cleaning section 30 by the rotation of the microcapsule supporting member 44. First, the nitrogen gas injector 34 is actuated to inject nitrogen gas onto the residue so that the residue is subjected to a nitrogen atmosphere free from oxygen. Then, the after-exposure lamp 33 is turned on to apply light to the residue in the nitrogen atmosphere. As a result, the liquid component 3B of the residue exposed to light is generally cured, and accordingly, the residue totally becomes solid matter. Then, the residue, thus solidified, is removed from the microcapsule supporting member 44 by the cleaning blade 31 in the cleaning section 30, and is recovered into the recovery unit 32. After the cleaning operation, the microcapsule supporting member 44 can again be used.

In a coordinated manner, the image receiving paper 52 is taken from the paper feed cassette 51 and is supplied to between the transfer member 45 and the heat roller 46. At that time, the liquid component 3A transferred from the microcapsule supporting member 44 to the transfer member 45 is conveyed to the upper side of the heat roller 46 by the rotation of the transfer member 45 in the direction of an arrow in FIG. 1. Accordingly, the image receiving paper 52 and the liquid component 3A on the transfer member 45 are heated by the heat roller 46. As a result, the liquid component 3A is transferred from the transfer member 45 to the image receiving paper 52 and dried. Since the liquid component 3A contains the image forming material, an image corresponding to the image of the original 12 is formed on the image receiving paper 52. Then, the image receiving paper 52 on which the image has been formed is ejected from the eject opening 53 to the outside of the image forming apparatus 7. Any liquid component 3A remaining on the transfer member 45 downstream of heat roller 46, that is, after transfer of liquid component 3A to the image receiving paper 52, is subsequently removed by cleaning member 45A.

As is apparent from the above description, the residue left on the microcapsule supporting member 44 is totally exposed to light in the nitrogen atmosphere to become a solid matter. Then, the residue thus solidified is easily and completely removed from the microcapsule supporting member 44 by the cleaning blade 31. Therefore, the cleaning of the surface of the microcapsule supporting member 44 is easily and completely effected.

A construction of the image forming apparatus in a second preferred embodiment according to the invention will now be described with reference to FIG. 2.

Reference numeral 70 generally designates an image forming apparatus in the second preferred embodiment in which the same parts as those of the image forming apparatus, of the first preferred embodiment, are designated by the same reference numerals.

Figure 2:
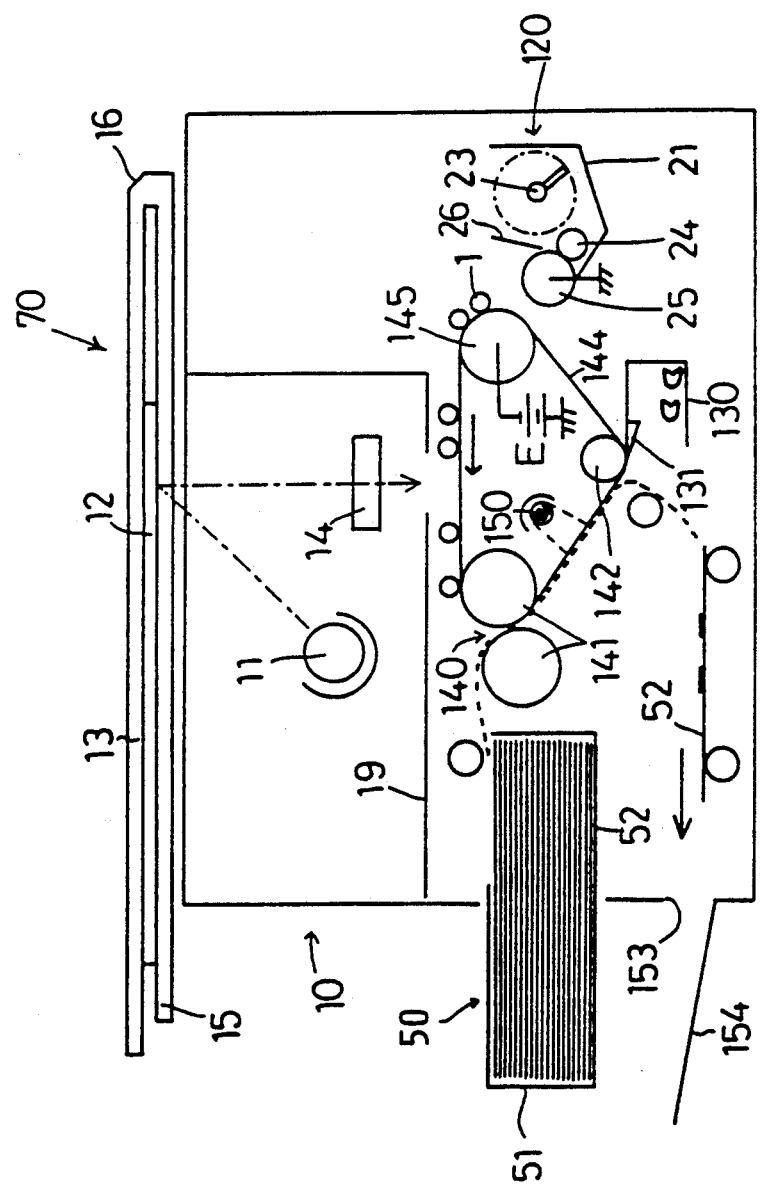
FIG. 2 is a schematic illustration of an image forming apparatus in a second preferred embodiment according to the invention.

An eject opening 153 for ejecting an image receiving paper 52 after an image has been formed thereon is formed through a side wall of a housing of the image forming apparatus 70 at a left lower portion thereof as viewed in FIG. 2. An original table 16 is provided on an upper surface of the housing so as to be movable rightward and leftward as viewed in FIG. 2. An ejected paper tray 154 is provided under the eject opening 153 so as to receive the image receiving paper 52 ejected from the eject opening 153 to the outside of the image forming apparatus 70 and store a plurality of sheets of the ejected image receiving paper 52 in a stacked condition. The original table 16 has the same construction as that in the first preferred embodiment and so a detailed explanation thereof will be omitted herein.

The interior of the housing of the image forming apparatus 70 generally comprises an exposure section 10, a microcapsule supplying section 120, a cleaning section 130, a pressure developing section 140, a microcapsule supporting member 144, and a paper feeding section 50.

The exposure section 10 comprises a first exposure lamp 11, a filter 14, and a light shielding plate 19. The exposure section 10 has the same construction as that in the first preferred embodiment and so a detailed explanation thereof will be omitted herein.

The microcapsule supplying section 120 serves to supply the microcapsules 1 onto the microcapsule supporting member 144 by dry coating. The microcapsule supplying section 120 comprises a case 21, an agitator 23, a supply member 24, a carrier member 25, a layer thickness regulating blade 26, and an electrode roller 145. The microcapsules 1 are stored in the case 21. The agitator 23, the supply member 24 and the carrier member 25 are provided in the case 21.

The case 21, the agitator 23, the supply member 24 and the layer thickness regulating blade 26 respectively have substantially the same structure as that of comparable elements in the first preferred embodiment and so a detailed explanation thereof will be omitted herein.

Further, the carrier member 25 has substantially the same structure as that in the first preferred embodiment except that the carrier member 25 in the second preferred embodiment is grounded.

The electrode roller 145 is opposed to the carrier member 25 with a predetermined gap defined therebetween. The microcapsule supporting member 144, described later, is wrapped over the electrode roller 145. A DC power source E is connected to the electrode roller 145 so as to form an electric field between the electrode roller 145 and the carrier member 25 and thereby move the microcapsules 1 from the carrier member 25 to the microcapsule supporting member 144 wrapped over the electrode roller 145. When a power switch, not shown, of the power source E is turned on, an electric field is formed between the electrode roller 145 and the carrier member 25. In the case where the microcapsules 1 in the case 21 are positively charged, a negative voltage is applied to the electrode roller 145, while in the case where the microcapsules 1 in the case 21 are negatively charged, a positive voltage is applied to the electrode roller 145.

The microcapsule supporting member 144 is formed as an endless belt and it serves to receive the microcapsules 1 from the carrier member 25 and convey the microcapsules 1. The microcapsule supporting member 144 is wrapped over the electrode roller 145, one of the pressure rollers 141, described later, and a guide roller 142, explained later.

As will be hereinafter described in detail, it is necessary that light, having a wavelength capable of curing the liquid component 3 of each microcapsule 1, can be transmitted through the microcapsule supporting member 144 and that oxygen is inhibited from permeating the microcapsule supporting member 144. Therefore, the microcapsule supporting member 144 is preferably formed of a transparent resin film or the like. Alternatively, the microcapsule supporting member 144 may be formed of a material capable of transmitting light to be emitted from at least a second exposure lamp 150 which will be hereinafter described.

The pressure developing section 140 comprises a pair of pressure rollers 141 contacting each other under pressure. The image receiving paper 52 and the microcapsules 1 supported on the microcapsule supporting member 144 are adapted to be pressed between the pressure rollers 141 after exposure of the microcapsules 1 to light from the first exposure lamp 11, so that uncured ones of the microcapsules 1 on the microcapsule supporting member 144 are ruptured by the pressure of the pressure rollers 141.

The second exposure lamp 150 is located inside the microcapsule supporting member 144 and between the pressure roller 141 and the guide roller 142. The second exposure lamp 150 serves to apply light from the back side of the microcapsule supporting member 144, which can transmit the light, to the microcapsules 1 after being pressured.

The paper feeding section 50 has substantially the same construction as that in the first preferred embodiment and so a explanation thereof will be omitted herein. However, unlike the first preferred embodiment, the image receiving paper 52 when taken out of the paper feed cassette 51 is superposed on the microcapsule supporting member 144 with the microcapsules 1 that have been exposed by the first exposure lamp 11 and are then sandwiched under pressure between the pressure rollers 141.

The operation of the image forming apparatus 70 in the second preferred embodiment will be described with reference to FIGS. 2 and 3.

First, as in the first preferred embodiment, the operator sets the original 12 on the original table 16 and turns on a start switch (not shown). As a result, the microcapsules 1 in the case 21 of the microcapsule supplying section 120 are triboelectrically charged, and are carried in the form of a layer having a uniform thickness on the carrier member 25 in a manner similar to the first preferred embodiment. The microcapsules 1 on the carrier member 25 are electrostatically attracted to the electrode roller 145 by the electric field formed between the electrode roller 145 and the carrier member 25. As mentioned above, the microcapsule supporting member 144 is an endless belt that is wrapped over the electrode roller 145, one of the pressure rollers 141 and the guide roller 142. Accordingly, the microcapsules 1 carried on the carrier member 25 are moved to the outer surface of the microcapsule supporting member 144, and are attached thereon by an electrostatic force. Thus, the outer surface of the microcapsule supporting member 144 is uniformly coated with the powder of the microcapsules 1. Similar to the first preferred embodiment, the outer shell 2 of each microcapsule 1 has a sufficient strength such that the microcapsules 1 are not ruptured in the course of the above operation.

When the electrode roller 145 is rotated by a driving source (not shown) in a counterclockwise direction as viewed in FIG. 2 to thereby feed the microcapsule supporting member 144 in a direction shown by an arrow in FIG. 2, the microcapsules 1 supported on the microcapsule supporting member 144 are conveyed to the under side of the exposure section 10. At this time, the first exposure lamp 11 in the exposure section 10 is turned on to selectively expose the microcapsules 1 to light in a manner similar to the first preferred embodiment. Accordingly, a chemical latent image is formed in the layer of the microcapsules 1 on the microcapsule supporting member 144 owing to a difference in mechanical strength between the microcapsules 1 according to image information of the original 12. Thereafter, the microcapsules 1 thus exposed are conveyed to the pressure developing section 140. At the same time, the image receiving paper 52 is fed from the paper feed cassette 51 to the pressure developing section 140. In the pressure developing section 140, the microcapsule supporting member 144 and the image receiving paper 52 are superposed on each other under pressure between the pressure rollers 141 so that the microcapsules 1 supported on the microcapsule supporting member 144 are pressed between the microcapsule supporting member 144 and the image receiving paper 52 by the pressure rollers 141. In this stage, some of the microcapsules 1, those weakly exposed to light, are not cured and, accordingly, the thus uncured microcapsules 1 are ruptured by the pressure of the pressure rollers 141. As a result, the liquid component 3 including the image forming material of the uncured microcapsules 1 is discharged and deposited onto the image receiving paper 52, thus forming an image corresponding to the image of the original 12 on the image receiving paper 52.

Just after forming the image on the image receiving paper 52, the image receiving paper 52 is attached to the microcapsule supporting member 144 by the liquid component 3 discharged from the ruptured microcapsules 1. Then, both the microcapsule supporting member 144 and the image receiving paper 52 attached thereto are conveyed to a position opposed to the second exposure lamp 150, and the microcapsules 1 are exposed to light emitted from the second exposure lamp 150, from the back side (i.e., the inner side) of the microcapsule supporting member 144. As a result, only a part of the liquid component 3 existing near the microcapsule supporting member 144 is cured to thereby fix the outer shell 2 of the ruptured microcapsules 1 and the cured microcapsules 1 to the outer surface of the microcapsule supporting member 144 in the following manner.

Figure 3:
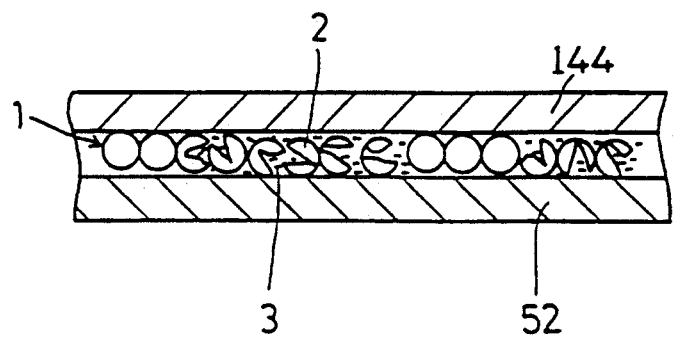
FIG. 3 is a schematic enlarged sectional view illustrating a condition of photosensitive microcapsules just after pressure development in the second preferred embodiment.

More specifically, referring to FIG. 3, cured microcapsules 1 and ruptured (uncured) microcapsules 1 are present between the microcapsule supporting member 144 and the image receiving paper 52. Each ruptured microcapsule 1 is present as the outer shell 2 and the liquid component 3 separated from each other. In this condition, the microcapsules 1 sandwiched between the microcapsule supporting member 144 and the image receiving paper 52 are exposed to the light by the second exposure lamp 150 from the back side (i.e., the upper side as viewed in FIG. 3) of the microcapsule supporting member 144. Since the microcapsule supporting member 144 is not oxygen permeable while the image receiving paper 52 is oxygen permeable, the following phenomenon is considered to occur. That is, the photocuring resin contained in the liquid component 3 is hard to cure in the presence of oxygen. Therefore, a part of the liquid component 3 existing near the microcapsule supporting member 144 in the environment of substantially no oxygen is sufficiently cured to fix the cured microcapsules 1 and the outer shell 2 of the ruptured microcapsules 1 to the microcapsule supporting member 144. On the other hand, a major part of the liquid component 3 existing in the vicinity of the image receiving paper 52 in the presence of oxygen is not cured. Accordingly, the liquid component 3 having not been cured is deposited onto or absorbed by the image receiving paper 52, thus forming an image on the image receiving paper 52.

As mentioned above, the cured microcapsules 1 and the outer shell 2 of the ruptured microcapsules 1 are fixed to the microcapsule supporting member 144 by the part of the liquid component 3 solidified by the light from the second exposure lamp 150. Accordingly, when the image receiving paper 52 is separated from the microcapsule supporting member 144 at the guide roller 142, the solid matter inclusive of the outer shell 2 fixed to the microcapsule supporting member 144 is clearly separated from the image receiving paper 52. Thereafter, the solid matter on the microcapsule supporting member 144 is easily removed from the microcapsule supporting member 144 by the cleaning blade 131 and is recovered to the cleaning section 130.

As is apparent from the above description, according to the image forming apparatus of the invention, the residue on the microcapsule supporting member is solidified and is then removed from the microcapsule supporting member. Accordingly, the cleaning operation of the microcapsule supporting member can be easily performed, and a clear image with no stain can be formed on the image receiving paper.

It is to be noted that the above preferred embodiments are merely illustrative and various modifications may be made without departing from the scope of the invention.

For example, although the image receiving paper 52 is employed in the second preferred embodiment, any other image receiving medium having an oxygen permeability may be employed.

What is claimed is:

1. An image forming apparatus using photosensitive microcapsules consisting of an outer shell and a core substance encapsulated in the outer shell, the core substance containing an image forming material and a photocuring substance, the image forming material being selected from the group consisting of a dye precursor, a dye and a pigment, the photocuring substance being polymerizable to be cured by application of light having a predetermined wave length thereto, said image forming apparatus comprising:
   a support member which is capable of supporting the photosensitive microcapsule thereon;
   exposure means for exposing to light having a image information the photosensitive microcapsules provided on said support member in order to selectively change the mechanical hardness of the photosensitive microcapsules;
   pressure applying means for rupturing unhardened photosensitive microcapsules after exposure to light by said exposure means to discharge the core substance from the unhardened photosensitive microcapsules;
   re-exposure means for re-exposing and hardening material remaining which includes at least some core substance existing on said support member in order to harden the material remaining;
   removing means for removing the hardened material remaining on said support member; and
   recovery means for recovering the hardened material remaining removed by said removing means.

2. The imaging forming apparatus according to claim 1, further comprising means for creating an oxygen free atmosphere.

3. The image forming apparatus according to claim 2, wherein said means for creating an oxygen free atmosphere is immediately upstream of said re-exposure means.

4. The image forming apparatus according to claim 3, wherein said means for creating an oxygen free atmosphere is a nitrogen gas injector.

5. The image forming apparatus according to claim 2, wherein said means for creating an oxygen free atmosphere is a transparent supporting medium.

6. The image forming apparatus according to claim 1, wherein the removing means is a blade contacting the surface of the support medium.

7. The image forming apparatus according to claim 1, wherein said support member has a cylindrical shape and said pressure applying means is a transfer medium for pressuring said support member, said pressure applying means having a cylindrical shape.

8. The image forming apparatus according to claim 7, wherein most of the core substance discharged from the ruptured photosensitive microcapsules by pressure between said support member and said transfer medium is transferred onto a surface of said transfer medium.

9. The image forming apparatus according to claim 8, further comprising re-transfer means for retransferring the core substance transferred onto the surface of said transfer medium to an image receiving medium.

10. The image forming apparatus according to claim 9, wherein said re-exposure means exposes only the surface of said support member.

11. The image forming apparatus according to claim 10, further comprising nitrogen gas supplying means for creating an oxygen free atmosphere on the surface of said support member when said re-exposure means exposes the surface of said support member.

12. The image forming apparatus according to claim 9, further comprising cleaning means for removing any core substance remaining on the surface of the transfer medium after said re-transfer means transfers the core substance on the transfer medium to the image receiving medium.

13. The image forming apparatus according to claim 1, further comprising:
   charge supplying means having at least an electrode roller; and
   a guide roller, wherein said pressure applying means comprises a pair of pressure rollers, said support member comprising an endless belt wound around among said electrode roller, one of said pressure rollers and said guide roller.

14. The image forming apparatus according to claim 13, further comprising image receiving medium supplying means for supplying the image receiving medium between said pressure rollers, said pressure rollers adding pressure from both sides of the image receiving medium and the microcapsules exposed by said exposure means on said endless belt.

15. The image forming apparatus according to claim 14, wherein the image receiving medium is separated from said endless belt at said guide roller after said photosensitive microcapsules have been selectively ruptured by said pressure rollers.

16. The image forming apparatus according to claim 15, wherein said endless belt is capable of transmitting at least visible light and is impermeable to oxygen.

17. The image forming apparatus according to claim 16, wherein said re-exposure means is provided between said guide roller and one of said pressure rollers on a side of said endless belt opposite the image receiving medium side, said re-exposure means re-exposing remaining material on said endless belt before said image receiving medium is separated from said endless belt.

18. The image forming apparatus according to claim 7, wherein said recovery means includes a shield member positioned to prevent light from said re-exposure means from illuminating said transfer medium and a point where the photosensitive microcapsules are ruptured between said support member and said transfer medium.

19. A method for using photosensitive microcapsules carried on a support medium for producing copies of original images, comprising the steps of:
   exposing the photosensitive microcapsules to light having image information;
   superposing the supporting medium with a recording medium with the photosensitive microcapsules therebetween;
   applying pressure to the support medium and recording medium to rupture unhardened microcapsules;
   re-exposing residue left on the support medium to light to harden the residue;
   removing the residue from the support medium; and
   recovering the removed residue.

20. The method according to claim 19, further comprising the step of creating an oxygen free atmosphere for the re-exposing step.

21. An image forming apparatus using photosensitive microcapsules producing copies of original images comprising:
   a support medium for carrying the photosensitive microcapsules;
   means for exposing the photosensitive microcapsules to light having image information;
   means for superposing the support medium with a recording medium with the photosensitive microcapsules therebetween;
   means for applying pressure to the support medium and recording medium to rupture unhardened microcapsules;
   means for re-exposing residue left on the support medium to light to harden the residue;
   means for removing the residue from the support medium; and
   means for recovering the removed residue.

22. The image forming apparatus according to claim 21, further comprising means for creating an oxygen free environment for re-exposing the residue.

23. The image forming apparatus according to claim 22, wherein said support medium is a cylindrical drum.

24. The image forming apparatus according to claim 23, wherein said means for creating an oxygen free atmosphere is a nitrogen gas injector.

25. The image forming apparatus according to claim 21, wherein said support medium is a transparent atmosphere impermeable endless belt.

26. The image forming apparatus according to claim 25, wherein the means for re-exposing residue is on a side of said endless belt from where the residue is located.

* * * * *